(12) United States Patent
Nakayama et al.

(10) Patent No.: US 7,785,147 B2
(45) Date of Patent: *Aug. 31, 2010

(54) CONDUCTIVE CONTACT HOLDER AND CONDUCTIVE CONTACT UNIT

(75) Inventors: Hiroshi Nakayama, Nagano (JP); Mitsuhiro Nagaya, Nagano (JP)

(73) Assignee: NHK Spring Co., Ltd., Yokohama-shi, Kanagawa (JP)

( * ) Notice: Subject to any disclaimer, the term of this patent is extended or adjusted under 35 U.S.C. 154(b) by 14 days.

This patent is subject to a terminal disclaimer.

(21) Appl. No.: 12/087,118

(22) PCT Filed: Dec. 20, 2006

(86) PCT No.: PCT/JP2006/325430

§ 371 (c)(1),
(2), (4) Date: Oct. 8, 2008

(87) PCT Pub. No.: WO2007/074700

PCT Pub. Date: Jul. 5, 2007

(65) Prior Publication Data

US 2009/0221186 A1    Sep. 3, 2009

(30) Foreign Application Priority Data

Dec. 27, 2005   (JP)   ............................. 2005-375257

(51) Int. Cl.
*H01R 13/648*   (2006.01)
(52) U.S. Cl. ............................................. 439/607.05
(58) Field of Classification Search ............ 439/607.05, 439/607.08, 607.55–607.58, 108
See application file for complete search history.

(56) References Cited

U.S. PATENT DOCUMENTS

| 5,037,332 | A  | * | 8/1991  | Wilson ................... 439/607.03 |
| 5,178,549 | A  | * | 1/1993  | Neumann et al. ............. 439/74 |
| 5,803,768 | A  | * | 9/1998  | Zell et al. ................ 439/607.1 |
| 7,470,149 | B2 | * | 12/2008 | Kazama et al. ........ 439/607.05 |

FOREIGN PATENT DOCUMENTS

| JP | 2001-099889 | 4/2001 |
| JP | 2002-124552 | 4/2002 |
| JP | 2002-340975 | 11/2002 |
| JP | 2005-156530 | 6/2005 |

OTHER PUBLICATIONS

International Search Report dated Feb. 13, 2007, issued on PCT/JP2006/325430.

* cited by examiner

*Primary Examiner*—Gary F. Paumen
(74) *Attorney, Agent, or Firm*—Edwards Angell Palmer & Dodge LLP

(57) ABSTRACT

A conductive contact holder and a conductive contact unit with improved corrosion resistance and with excellent durability are provided. To this end, there is provided: a holder substrate having a first opening that accepts a signaling conductive contact that inputs and outputs a signal to and from a circuitry, and a second opening that accepts a grounding conductive contact for supplying a ground potential to the circuitry; a first holding member that is inserted into the first opening to hold the signaling conductive contact; and an insulating coat that is made of an insulating material, and covers at least one surface of the holder substrate.

15 Claims, 8 Drawing Sheets

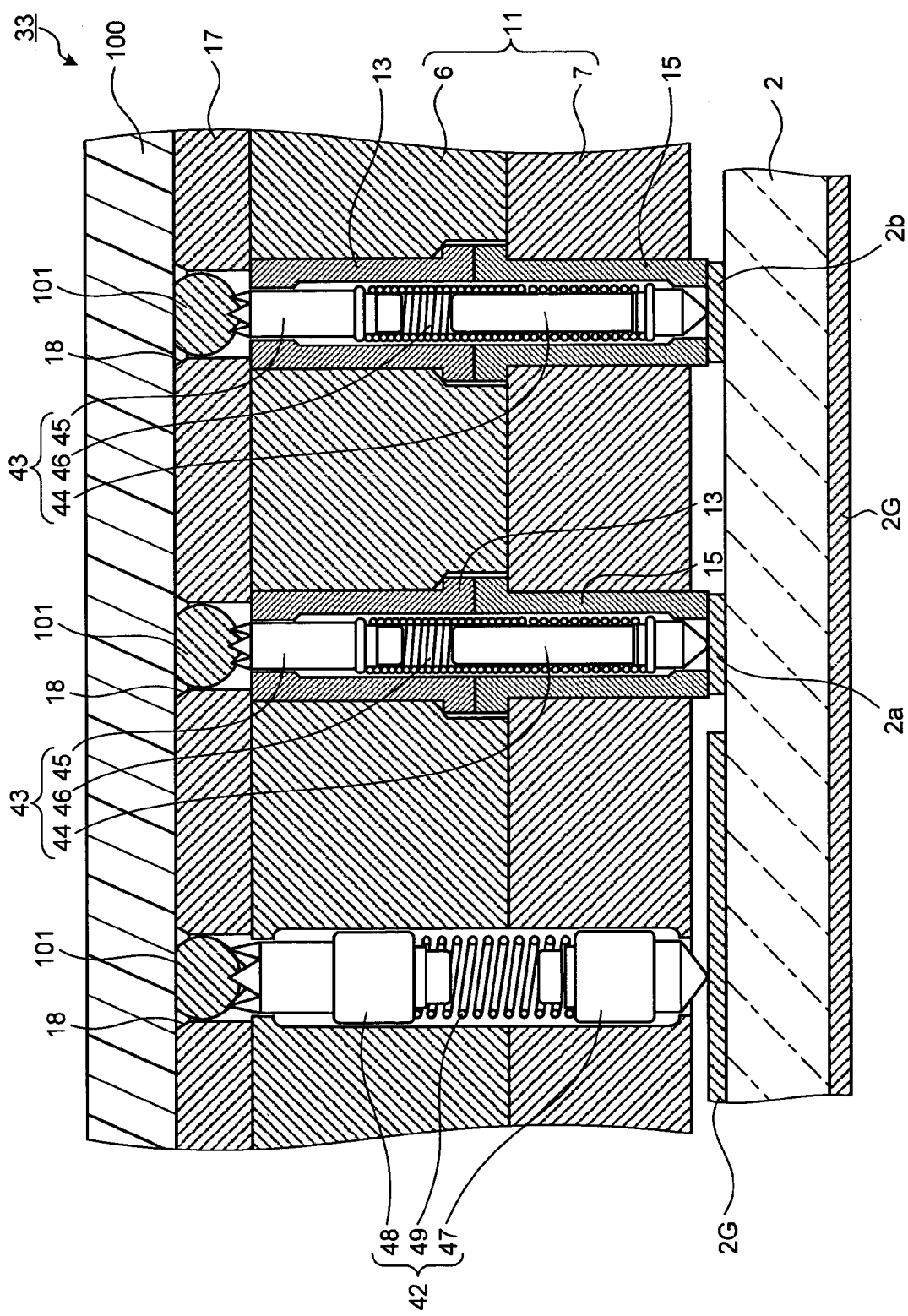

CONDUCTIVE CONTACT HOLDER AND CONDUCTIVE CONTACT UNIT

TECHNICAL FIELD

The present invention relates to a conductive contact holder and a conductive contact unit that contains at least a signaling conductive contact that inputs and outputs a signal to and from a predetermined circuitry, and a grounding conductive contact that supplies a ground potential to the circuitry.

BACKGROUND ART

Conventionally, in a technological field of electrical characteristic testing of a semiconductor integrated circuit, there is a known technology related to a conductive contact unit provided with a plurality of conductive contacts, each of which is arranged correspondingly to an external connecting terminal of the semiconductor integrated circuit. Such a conductive contact unit has a structure having a plurality of conductive contacts, a conductive contact holder having openings that accept the conductive contacts, and a test circuit that is electrically connected to the conductive contacts (for example, see Patent Document 1).

Generally, each of the conductive contacts included in the conductive contact unit is classified into: a signaling conductive contact that inputs and outputs an electrical signal to and from the semiconductor integrated circuit, that is, an test object; a grounding conductive contact that supplies a ground potential to the semiconductor integrated circuit; and a power-supplying conductive contact that supplies driving power to the semiconductor circuit. Each of the conductive contacts realizes the function thereof by being electrically connected to a signal generating circuit, for example, provided in the test circuit.

A holder substrate that contains the conductive contacts, is generally made of a conductive material, and has a potential equal to the ground potential. Because this holder substrate can cause a short circuit if the holder substrate is brought in contact with an electrode on the circuit substrate, or an electrode on the test object, it is necessary to provide an insulating layer. This insulating layer is often formed by coating.

On the contrary, on the inner circumference of an opening where the grounding conductive contact is inserted, a surface process, such as gold plating, is provided in some cases to improve electrical contact and prevent abrasion.

When the insulating layer is to be formed over the holder substrate, and the surface process is to be provided as described above, the insulating layer is at first formed by coating, the openings are formed thereon to accept these types of conductive contacts, and subsequently surface process, such as gold plating, is provided.

Patent Document 1: Japanese Patent Application Laid-open No. 2002-124552 (FIG. 1)

DISCLOSURE OF INVENTION

Problem to be Solved by the Invention

When the holder substrate is subjected to the surface process, such as gold plating, as described above, the holder substrate is dipped into a strong alkali or acid; however, because a known insulating layer is made of a material such as epoxy resin, corrosion can occur in this dipping process.

The present invention is developed to solve the problem above, and to provide a conductive contact holder and a conductive contact unit with improved corrosion resistance of the insulating layer, as well as with excellent durability.

Means for Solving Problem

A conductive contact holder according to an aspect of the present invention contains at least a signaling conductive contact for inputting and outputting a signal to and from a circuitry, and a grounding conductive contact that supplies a ground potential to the circuitry. The conductive contact holder includes a holder substrate that is made of a conductive material, and has a first opening for accepting the signaling conductive contact and a second opening for accepting the grounding conductive contact; a first holding member that is made of an insulating material, and inserted into the first opening to hold the signaling conductive contact; and an insulating coat that is made of an insulating material, and covers at least one surface of the holder substrate.

In the conductive contact holder, the insulating coat may be provided on one surface of the holder substrate, and the first holding member may protrude from a surface of the holder substrate on which the insulating coat is not provided.

In the conductive contact holder, the insulating coat may be made of fluorine resin.

In the conductive contact holder, an inner circumferential surface of the second opening may be gold-plated.

In the conductive contact holder, the holder substrate may further include a first substrate that is made of a conductive material, and has a fourth opening and a fifth opening corresponding respectively to the first opening and the second opening; and a second substrate that is made of a conductive material, has a sixth opening and a seventh opening corresponding respectively to the first opening and the second opening, and is fixed to the first substrate so that the sixth opening communicates with the fourth opening and the seventh opening communicates with the fifth opening, and the first holding member may include a first insulating pipe member that is inserted into the fourth opening; and a second insulating pipe member that is inserted into the sixth opening.

In the conductive contact holder, the first insulating pipe member may have a disengagement-preventing flange at one end thereof, and the disengagement-preventing flange may be inserted in the fourth opening so as to face a boundary between the first substrate and the second substrate, and the second insulating pipe member may have a disengagement-preventing flange at one end thereof, and the disengagement-preventing flange may be inserted in the sixth opening so as to face the boundary between the first substrate and the second substrate.

In the conductive contact holder, the holder substrate may have a third opening for accepting a power-supplying conductive contact for supplying power to the circuitry, and the conductive contact holder may further include a second holding member that is made of an insulating material, and inserted into the third opening to hold the power-supplying conductive contact.

A conductive contact holder according to another aspect of the present invention contains at least a signaling conductive contact for inputting and outputting a signal to and from a circuitry, and a grounding conductive contact that supplies a ground potential to the circuitry. The conductive contact holder includes a holder substrate that is made of a conductive material, and has a first opening for accepting the signaling conductive contact and a second opening for accepting the grounding conductive contact; and a first holding member that is made of an insulating material, and inserted into the first opening to hold the signaling conductive contact, wherein at least one end of the first holding member protrudes from a surface of the holder substrate.

The conductive contact holder may further include a plate-like floating member that is arranged facing a surface of the holder substrate, from which surface the end of the first holding member does not protrude, and that includes a plurality of holes arranged correspondingly to wiring patterns of the circuitry.

In the conductive contact holder, an inner circumferential surface of the second opening may be gold-plated.

In the conductive contact holder, the holder substrate may further include a first substrate that is made of a conductive material, and has a fourth opening and a fifth opening corresponding respectively to the first opening and the second opening; and a second substrate that is made of a conductive material, has a sixth opening and a seventh opening corresponding respectively to the first opening and the second opening, and is fixed to the first substrate so that the sixth opening communicates with the fourth opening and the seventh opening communicates with the fifth opening, and the first holding member includes a first insulating pipe member that is inserted into the fourth opening; and a second insulating pipe member that is inserted into the sixth opening.

In the conductive contact holder, the first insulating pipe member may have a disengagement-preventing flange at one end thereof, and the disengagement-preventing flange may be inserted in the fourth opening so as to face a boundary between the first substrate and the second substrate, and the second insulating pipe member may have a disengagement-preventing flange at one end thereof, and the disengagement-preventing flange may be inserted in the sixth opening so as to face the boundary between the first substrate and the second substrate.

In the conductive contact holder, the holder substrate may have a third opening for accepting a power-supplying conductive contact for supplying power to the circuitry, and the conductive contact holder may further include a second holding member that is made of an insulating material, and inserted into the third opening to hold the power-supplying conductive contact.

A conductive contact unit according to another aspect of the present invention includes the conductive contact holder according to the present invention; a signaling conductive contact, for inputting and outputting a signal to and from the circuitry, contained in the conductive contact holder; a grounding conductive contact that is contained in the conductive contact holder, and supplies a ground potential to the circuitry; and a circuit substrate that is electrically connected to at least the signaling conductive contact, and has a circuit that generates a signal to be input to the circuitry.

EFFECT OF THE INVENTION

According to one aspect of the present invention, there is provided: a holder substrate provided with a first opening that accepts a signaling conductive contact that inputs and outputs a signal to and from a circuitry, and a second opening that accepts a grounding conductive contact for supplying a ground potential to the circuitry; a first holding member that is inserted into the first opening to hold the signaling conductive contact; and an insulating coat that is made of an insulating material, and covers at least one surface of the holder substrate. Therefore, it is possible to provide a conductive contact holder and a conductive contact unit with improved corrosion resistance of the insulating layer, as well as with excellent durability.

BRIEF DESCRIPTION OF DRAWINGS

FIG. 8 is a schematic of positions of the conductive contact holder and the conductive contacts included in the conductive contact unit according to the fourth embodiment during a test.

Figure 1:
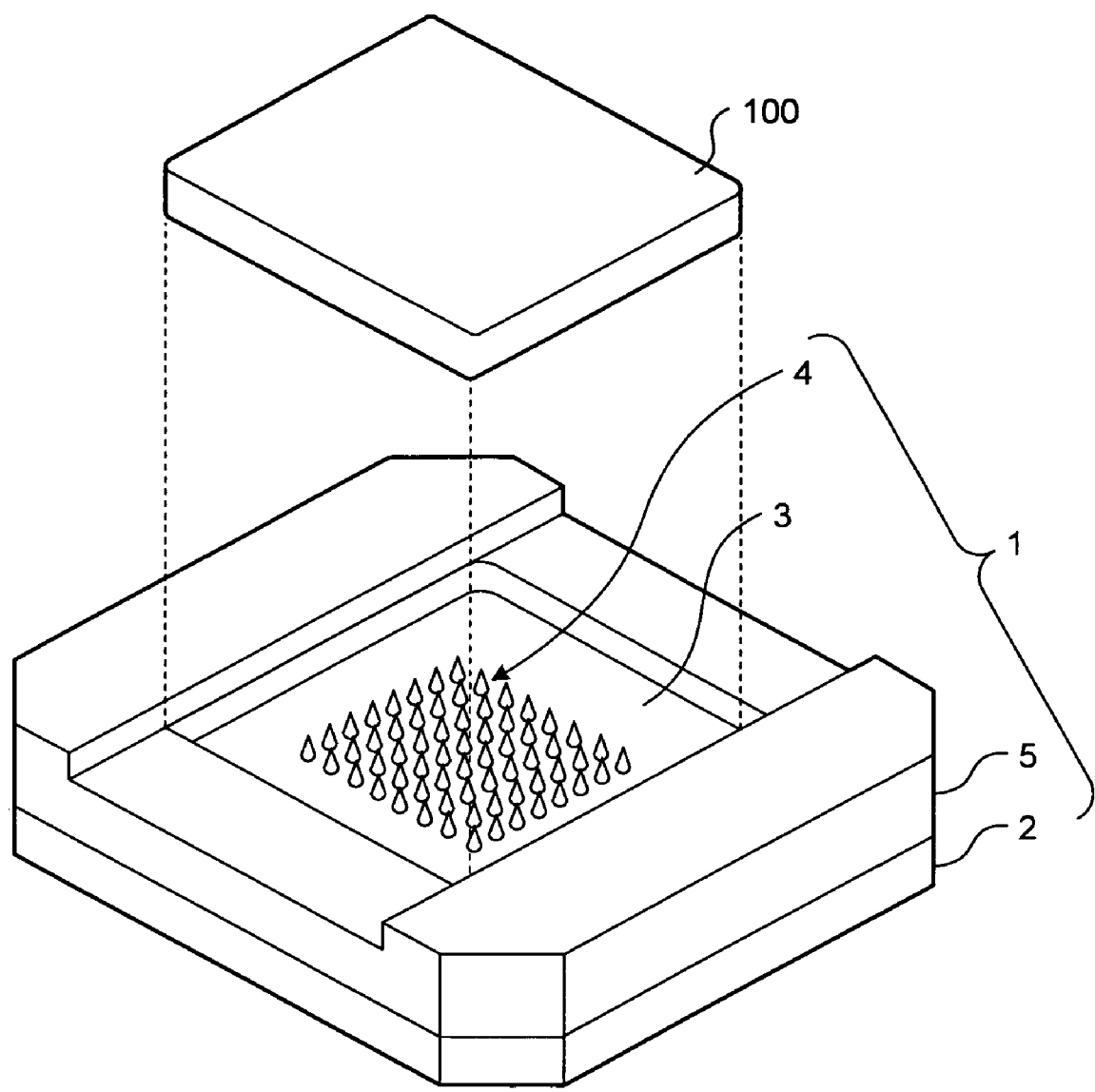
FIG. 1 is a perspective view of an entire structure of a conductive contact unit according to a first embodiment of the present invention.

EXPLANATIONS OF LETTERS OR NUMERALS 1 conductive contact unit
2 circuit substrate
2a signaling electrode
2b power-supplying electrode
2G grounding electrode
3, 31, 32, 33 conductive contact holder
4 conductive contact
5 holder member
6 first substrate
7 second substrate
8 first opening
9 second opening
10 third opening
11 holder substrate
12 fluorine coat (insulating coat)
13, 16 first insulating pipe member
14, 15 second insulating pipe member
17 floating member
18 hole
21a, 21b fourth opening
22 fifth opening
23a, 23b sixth opening
24 seventh opening
25, 26, 27, 28 disengagement-preventing flange
41 signaling conductive contact
42 grounding conductive contact
43 power-supplying conductive contact
44, 45, 47, 48 needle-shaped member
46, 49 spring member
51, 52, 441, 451 flange element
100 semiconductor integrated circuit
101 connecting electrode

BEST MODE(S) FOR CARRYING OUT THE INVENTION

Best modes for carrying out the present invention (hereinafter, "embodiments") will be now explained with reference to the attached drawings. It should be noted that the drawings are just schematic representations, and the relationship between a thickness and a width of each element, or a thickness ratio of each element may be different from those in reality. Moreover, it should be obvious that a relationship or a ratio of dimensions might be different in each of the drawings.

First Embodiment

FIG. 1 is a perspective view of a structure of a conductive contact unit according to a first embodiment of the present invention. A conductive contact unit 1, shown in FIG. 1, includes: a circuit substrate 2 provided with a circuit that executes processes such as generation of a signal for supplying to a semiconductor integrated circuit 100; a conductive contact holder 3 arranged above the circuit substrate 2 and having predetermined openings (not shown in FIG. 1); and conductive contacts 4 that are accepted in the openings provided on the conductive contact holder 3. Moreover, a holder member 5, provided to prevent the semiconductor integrated circuit 100 from being out of alignment during usage, is arranged on top of the circuit substrate 2 and around the outer circumference of the conductive contact holder 3.

The circuit substrate 2 includes a test circuit for testing the electrical characteristics of the semiconductor integrated circuit 100, which is a test object. The circuit substrate 2 has a structure having electrodes (not shown in FIG. 1), arranged on the surface thereof that is brought in contact with the conductive contact holder 3, for electrically connecting an internal circuit thereon to the conductive contacts 4.

The conductive contacts 4 electrically connect the internal circuit of the circuit substrate 2 to the semiconductor integrated circuit 100. The conductive contacts 4 are classified into three types, depending on types of signals it provides to the semiconductor integrated circuit. More specifically, the conductive contacts 4 include: a signaling conductive contact that inputs and outputs an electrical signal to and from the semiconductor integrated circuit 100; a grounding conductive contact that supplies a ground potential to the semiconductor integrated circuit 100; and a power-supplying conductive contact that supplies power to the semiconductor integrated circuit 100. In the following descriptions, when a reference is made inclusively to the signaling conductive contact, the grounding conductive contact, and the power-supplying conductive contact, the terminology "conductive contacts 4" will be used. When a reference is made individually, each terminology will be used respectively.

Figure 2:
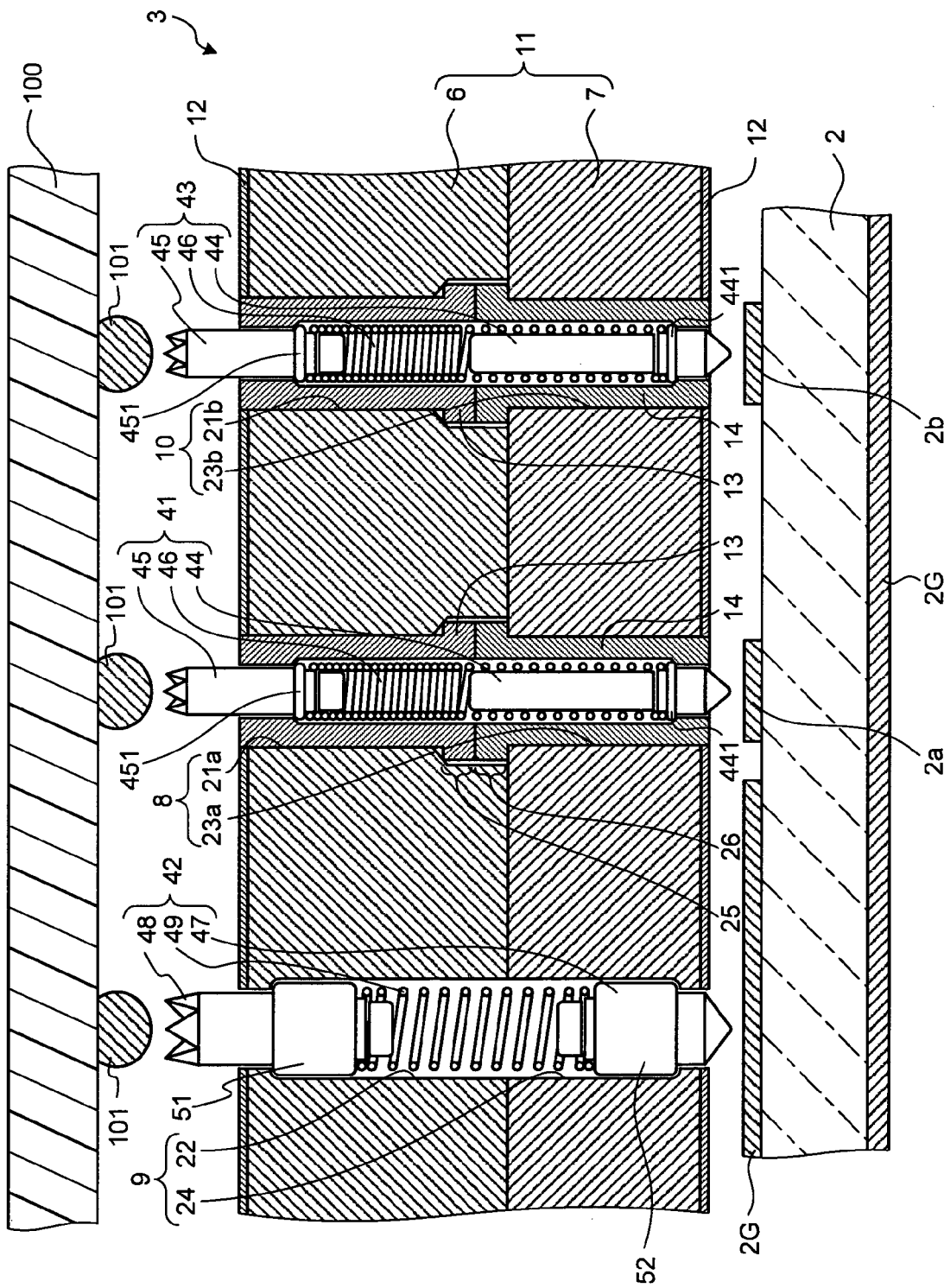
FIG. 2 is a schematic of detailed structures of a conductive contact holder and conductive contacts included in the conductive contact unit according to the first embodiment.

FIG. 2 is a schematic of detailed structures of the conductive contact holder 3 and the conductive contacts 4. The conductive contact holder 3, shown in FIG. 2, includes a holder substrate 11 made of a conductive material such as a metal, and a fluorine coat 12 that is an insulating coat, covering the surfaces of the holder substrate 11 and made a film-like fluorine resin. The conductive contact holder 3 contains the conductive contacts 4.

The holder substrate 11 has a structure with a plurality of substrates, layered over one another, made of a conductive material such as a conductive metal or a conductive resin. More specifically, the holder substrate 11 is made from a first substrate 6 and a second substrate 7, each of which is made of a conductive material, joined together with a screwing member (not shown). The holder substrate 11 also includes a first opening 8, a second opening 9, and third opening 10, each of which penetrates through the first substrate 6 and the second substrate 7.

On the first substrate 6, fourth openings 21a and 21b are formed respectively at positions corresponding to the first opening 8 and the third opening 10. A fifth opening 22 is formed at a position corresponding to the second opening 9. On the second substrate 7, sixth openings 23a and 23b are formed respectively at positions corresponding to the first opening 8 and the third opening 10, and a seventh opening 24 is formed at a position corresponding to the second opening 9. The holder substrate 11 is made from the first substrate 6 and the second substrate 7 being fixed together in contact with each other so that the fourth opening 21a communicates with the sixth opening 23a, the fourth opening 21b communicates with the sixth opening 23b, and the fifth opening 22 communicates with the seventh opening 24, along common axes.

The fluorine coat 12, which is an insulating coat formed on the surfaces (the top surface and the bottom surface) of the holder substrate 11, is provided to prevent a short circuit caused by the main body of the holder substrate 11, which is at the ground potential, being brought in contact with a signaling electrode 2a or a power-supplying electrode 2b provided on the circuit substrate 2, or with connecting electrodes 101 provided on the semiconductor integrated circuit 100. The fluorine coat 12 having such a function is formed by coating, such as calendar processing, extrusion, dipping, spraying, spreading, or electrodisposition. The fluorine coat 12 may also be formed by other methods, such as chemical vapor deposition (CVD).

Especially, the fluorine coat 12 has excellent heat resistance, and its maximum operation temperature is 260 Celsius degree; therefore, it can sufficiently tolerate the high temperature environment during the tests. The fluorine resin, used for the fluorine coat 12, has dielectric strength of 19 MV/m, which is an insulating capability equal to other insulating materials.

Furthermore, the fluorine resin has another advantage that it can be easily cleaned by wiping with a waste cloth even if the surface thereof gets smeared.

The fluorine coat 12 is also highly durable. A conventional coating, made of epoxide resin for example, could be peeled off from the surface of the holder substrate 11 when scratched. However, in the first embodiment, the fluorine resin is used to form the fluorine coat 12; therefore, the fluorine coat 12 will not be peeled off, due to its high flexibility and adhesiveness.

The first opening 8, the second opening 9, and the third opening 10, which are formed on the holder substrate 11, respectively accept a signaling conductive contact 41 that inputs and outputs a signal to and from the semiconductor integrated circuit 100, a grounding conductive contact 42 that supplies the ground potential, and a power-supplying conductive contact 43 that supplies power. These openings, cylindrical in shape, are respectively formed to penetrate through the holder substrate 11, and function as aligning and guiding means for the conductive contacts to be accepted. Each of the openings is formed on the first substrate 6 and the second substrate 7, respectively, by way of drilling, etching, punching, using a laser, an electron beam, or ion beam processing, or a wire electric discharge.

If the holder substrate 11 is made of a metallic material such as Invar or Kovar material (registered trademark), the thermal expansion coefficient of the holder substrate 11 can be brought closer to that of silicon, which is the base material of the semiconductor integrated circuit 100. In other words, it is possible to realize the conductive contact holder 3 and the conductive contact unit 1 that can be used stably regardless of temperature change, by using the holder substrate 11 made of an appropriate metallic material so as to bring its thermal expansion coefficient to match that of a predetermined circuitry, such as the semiconductor integrated circuit 100.

From the perspective of the holder substrate 11 being effective for a grounding function and an electrical-field shielding function, which are to be described later, it is preferable to use a conductive material with low volume resistivity, in a range between 1 to 100 μΩ·cm, and high abrasion resistance, for example, gunmetal or beryllium copper.

Because the holder substrate 11 also functions to supply the ground potential, it is preferable for the electrical contact resistance between the first substrate 6 and the second substrate 7 to be as low as possible. Therefore, it is preferable to smooth out or to provide a surface process, such as nickel plating and gold plating, to the contact surface where the first substrate 6 and the second substrate 7 contact each other.

In the first opening 8 and the third opening 10 provided on the holder substrate 11, insulating members, each shaped like a hollow pipe, are inserted. More specifically, first insulating pipe members 13 are inserted into the fourth openings 21a, 21b, which are the openings of the first opening 8 and the third opening 10 on the first substrate 6, and second insulating pipe members 14 are inserted into the sixth openings 23a, 23b, which are the openings of the first opening 8 and the third opening 10 on the second substrate 7.

The signaling conductive contact 41 is inserted into the hollow parts of the first insulating pipe member 13 and the second insulating pipe member 14 that, in turn, are inserted into the first opening 8. The power-supplying conductive contact 43 is inserted into the hollow parts of the first insulating pipe member 13 and the second insulating pipe member 14 that, in turn, are inserted into the third opening 10. (In this sense, the first insulating pipe member 13 and the second insulating pipe member 14 that are inserted into the first opening 8 correspond to a first holding member mentioned in the claims, and the first insulating pipe member 13 and the second insulating pipe member 14 that are inserted into the third opening 10 correspond to a second holding member mentioned in the claims.) In this manner, the electrical insulations between the signaling conductive contact 41 or the power-supplying conductive contact 43 and the holder substrate 11 are ensured.

At one end of the first insulating pipe member 13, a disengagement-preventing flange 25, having a larger external diameter than other part thereof, is formed. The first insulating pipe member 13 is inserted into the first substrate 6 with this disengagement-preventing flange 25 facing the boundary between the first substrate 6 and the second substrate 7. In the similar manner, a disengagement-preventing flange 26 is formed at one end of the second insulating pipe member 14, and the second insulating pipe member 14 is inserted into the second substrate 7 with this disengagement-preventing flange 26 facing the boundary between the first substrate 6 and the second substrate 7.

Each of the hollow parts of the first insulating pipe member 13 and the second insulating pipe member 14 has a smaller internal diameter toward the other end thereof, which is opposing to the end formed with the disengagement-preventing flanges 25 and 26. It functions to prevent the accepted signaling conductive contact 41 and the power-supplying conductive contact 43 from being disengaged.

The first insulating pipe member 13 and the second insulating pipe member 14 are made of an insulating material such as Teflon (registered trademark). Teflon (registered trademark) can be easily processed and has low specific inductive capacity $\in_r$ of 2.1. Therefore, in comparison with those made of other materials, the outer diameter of the signaling conductive contact 41 can be made larger in the structure to achieve the same intrinsic impedance. By increasing the outer diameter of the signaling conductive contact 41 in this manner, it is possible to reduce the electrical resistance of the signaling conductive contact 41, as well as to suppress the attenuation of transmitted signals.

Furthermore, because the internal surfaces of the first insulating pipe member 13 and the second insulating pipe member 14 can be made smooth, it is possible to reduce a sliding resistance generated in telescopic motions of the signaling conductive contact 41 or the power-supplying conductive contact 43.

A structure of the conductive contacts 4 will be now explained. The signaling conductive contact 41 includes: a needle-shaped member 44 that is electrically connected to an electrode on the circuit substrate 2; a needle-shaped member 45 that is electrically connected to a connecting electrode on the semiconductor integrated circuit 100 during use; and a spring member 46 that is positioned between the needle-shaped member 44 and the needle-shaped member 45 to electrically connect the needle-shaped members 44, 45, and enables the signaling conductive contact 41 to make a telescopic movement in a long axis direction. The needle-shaped members 44, 45, and the spring member 46 are accepted in the first opening 8 so that each axial line is aligned with that of the first opening 8, and therefore, movable in the axial direction.

The needle-shaped member 44 is electrically connected to the electrode arranged on the surface of the circuit substrate 2. More specifically, the needle-shaped member 44 has a structure having a pointed end toward the circuit substrate 2, and the pointed end is connected to the electrode arranged on the circuit substrate 2. The needle-shaped member 44 can be moved in axial direction by way of an extending force of the spring member 46, and brought in contact with a recess and a protrusion of the electrode on the circuit substrate 2 in a most suitable manner. Moreover, the needle-shaped member 44 can be brought in contact with the electrode with reduced contact resistance, thanks to a pressing force generated by the spring member 46 in an extending direction thereof.

The needle-shaped member 44 also has a flange element 441 protruding in a direction perpendicular to its axial line, as shown in FIG. 2. As described above, because the internal diameter of the first opening 8 is made smaller toward the lower surface of the holder substrate 11, the flange element 441 is brought in contact with the second insulating pipe member 14, arranged inside the first opening 8, as the needle-shaped member 44 is moved downwardly; in this manner, the needle-shaped member 44 is prevented from being disengaged.

During a use of the conductive contract 1, the needle-shaped member 45 is electrically connected with the connecting electrode (bump) 101, which is approximately a sphere in shape, provided on the semiconductor integrated circuit 100. More specifically, the needle-shaped member 45 has a structure to contact with the connecting electrode 101 at an end thereof located closer to the semiconductor integrated circuit 100. In the same manner as the needle-shaped member 44, the needle-shaped member 45 can be moved in the axial direction by way of the extending force of the spring member 46. The needle-shaped member 45 also includes a flange element 451, protruding in a direction perpendicular to the axial line thereof, thus achieving a structure to be prevented from being disengaged. This structure enables the signaling conductive contact 41 to electrically connect to the electrode on the circuit substrate 2 and to the connecting electrode on the semiconductor integrated circuit 100.

The power-supplying conductive contact 43 has the same specific structure as that of the signaling conductive contact 41, although the functions achieved thereby are different. In other words, the power-supplying conductive contact 43 also includes the needle-shaped members 44 and 45, and the spring member 46. Therefore, detailed descriptions of a structure of the power-supplying conductive contact 43 are omitted herein.

An end of each of the needle-shaped members 45, provided to the signaling conductive contact 41 and the power-supplying conductive contact 43, is brought in contact with the connecting electrode 101 on the semiconductor integrated circuit 100. On the other hand, the tip of the needle-shaped member 44 of the signaling conductive contact 41 is brought in contact with the signaling electrode 2a provided on the circuit substrate 2, and the tip of the needle-shaped member 44 of the power-supplying conductive contact 43 is brought in contact with the power-supplying electrode 2b provided on the circuit substrate 2.

The grounding conductive contact 42 will be now explained. The grounding conductive contact 42 includes: a needle-shaped member 47 that are electrically connected to an electrode on the circuit substrate 2; a needle-shaped member 48 that is electrically connected to a connecting electrode on the semiconductor integrated circuit 100 during a use thereof; a spring member 49 that is positioned between the needle-shaped member 47 and the needle-shaped member 48 to electrically connect the needle-shaped members 47, 48 and to enable the grounding conductive contact 42 to make a telescopic movement in the long axial direction.

The needle-shaped members 47 and 48 have flange elements 51 and 52, respectively, and supply the electric potential of the holder substrate 11 to the semiconductor integrated circuit 100 through the flange elements 51 and 52 as a ground potential.

An end of the needle-shaped member 48, provided to the grounding conductive contact 42, is in contact with the connecting electrode 101 on the semiconductor integrated circuit 100. On the contrary, an end of the needle-shaped member 47 is in contact with a grounding electrode 2G that is arranged on the same surface of the circuit substrate 2 as the signaling electrode 2a and the power-supplying electrode 2b.

It is also possible to provide a surface process, having higher abrasion resistance and enabling conductivity improvement, to the inner circumference of the second opening 9, to improve the electrical contact between the grounding conductive contact 42 and the holder substrate 11. An example of such a surface process is gold plating. Before providing the gold plating, the fluorine coat 12 is at first provided over the surface of the holder substrate 11, and all of the openings formed. Subsequently, the gold plating is provided on the inner surface of the second opening 9.

Because the holder substrate 11 is dipped into a strong alkali or acid in the gold plating process, a known insulating coat, made of a material such as epoxide resin, corroded due to the strong alkali or acid during this dipping process. As a countermeasure to this problem, a touch-up (correction) was given to the corroded parts of the insulating coat; however, it was impossible to recover the original condition of the insulating coat before being provided with the gold plating. On the contrary, according to the first embodiment, the insulating coat is made of fluorine resin, which has extremely high corrosion resistance against strong alkali or acid, the insulating coat does not corrode during the gold plating process, omitting the need for the touch-ups of the coat. Therefore, it is possible to reduce the production cost of the holder substrate 11, as well as the time required for delivery. Furthermore, the unevenness of the insulating coat can be removed, thus achieving more reliable insulating performance.

From a perspective of reducing the contact resistance between the grounding conductive contact 42 and the holder substrate 11, it is preferable to increase a contact surface between thereof. Therefore, according to the first embodiment, the outer diameters of the flange elements 51 and 52 are made as large as possible, and the lengths thereof are made as long as possible, up to a point where the telescopic movement of the grounding conductive contact 42 is not inhibited, in the extending direction of the flange elements 51 and 52 (a vertical direction in FIG. 2). Such arrangements enable the grounding conductive contact 42 to effectively supply the ground potential from the holder substrate 11 to the semiconductor integrated circuit 100, further enabling the ground potential of the semiconductor integrated circuit 100 to be stabilized.

It is also effective to provide a material for reducing the electrical contact resistance, such as a contact refresher, to the outer surface of the grounding conductive contact 42, that is, for example, on the outer circumference of the flange elements 51 and 52. In the conductive contact unit 1 having such an arrangement, signal transmission loss will not increase even if a high-frequency signal is supplied to the semiconductor integrated circuit 100.

The grounding conductive contact 42 supplies not only the electrical potential from the circuit substrate 2 to the semiconductor integrated circuit 100 via the grounding electrode 2G, but also supplies the ground potential received from the holder substrate 11 to the semiconductor integrated circuit 100. As shown in FIG. 2, the insulating layer is not formed on the inner surface of the second opening 9, in which the grounding conductive contact 42 is received in the holder substrate 11. In this structure, the inner surface of the second opening 9 is brought in direct contact with the spring member 49 that is bent by the telescopic motion of the grounding conductive contact 42. As a result, the grounding conductive contact 42 and the holder substrate 11 that is made of a conductive material are electrically connected. In this manner, the electrical potential supplied by the grounding conductive contact 42 becomes equal to that of the holder substrate 11.

To assemble the conductive contact unit 1 having the structure described above, the corresponding insulating pipe members are inserted into the openings, such as the fourth opening 21a, formed on the first substrate 6 and the second substrate 7. Subsequently, the conductive contacts 4 are inserted into the hollow part of the first insulating pipe members 13. At this time, the first substrate 6, inserted with the first insulating pipe member 13, is arranged so that the side closer to the semiconductor integrated circuit 100 is positioned down in a vertical direction (that is, the surface that contacts with the second substrate 7 is positioned up in a vertical direction). Then, the second substrate 7 is layered over and fixed to the first substrate 6 that is inserted with the conductive contacts 4, so that the conductive contacts 4 are inserted into the hollow part of the second insulating pipe members 14 that, in turn, are inserted into the second substrate 7. Subsequently, the necessary members, such as circuit substrate 2 and the holder member 5, are assembled together to form a finished conductive contact unit 1.

In this manner, the conductive contact unit 1 comes to have a structure that achieves higher assembly-efficiency in mass production process. Furthermore, because each of the insulating pipe members is prevented from being disengaged by way of the disengagement-preventing flanges 25 and 26, each of the insulating pipe members can be removed from the corresponding openings by releasing the first substrate 6 and the second substrate 7 that are fixed together. Furthermore, because the conductive contacts 4 can be also removed easily by releasing the first substrate 6 and the second substrate 7 that are fixed together, tasks such as maintenance can be performed more easily.

According to the first embodiment described above, the conductive contact holder includes: a holder substrate having the first opening that accepts the signaling conductive contact that inputs and outputs a signal to and from the circuitry, and the second opening that accepts the grounding conductive contact for supplying the ground potential to the circuitry; the first holding member that is inserted into the first opening and holds the signaling conductive contact; and the insulating coat (fluorine resin) that is made of an insulating material and covers at least one surface of the holder substrate. Therefore, the insulating layer can have improved corrosion resistance; at the same time, it is also possible to realize the conductive contact holder and the conductive contact unit with excellent durability.

Furthermore, according to the first embodiment, the insulating coat is provided on the surface of the holder substrate. Therefore, it is possible to secure the insulation between the electrodes of the circuit substrate or that of semiconductor integrated circuit (test object) and the surface of the holder substrate; therefore, they can be prevented from being brought in contact and causing a short circuit.

Second Embodiment

Figure 3:
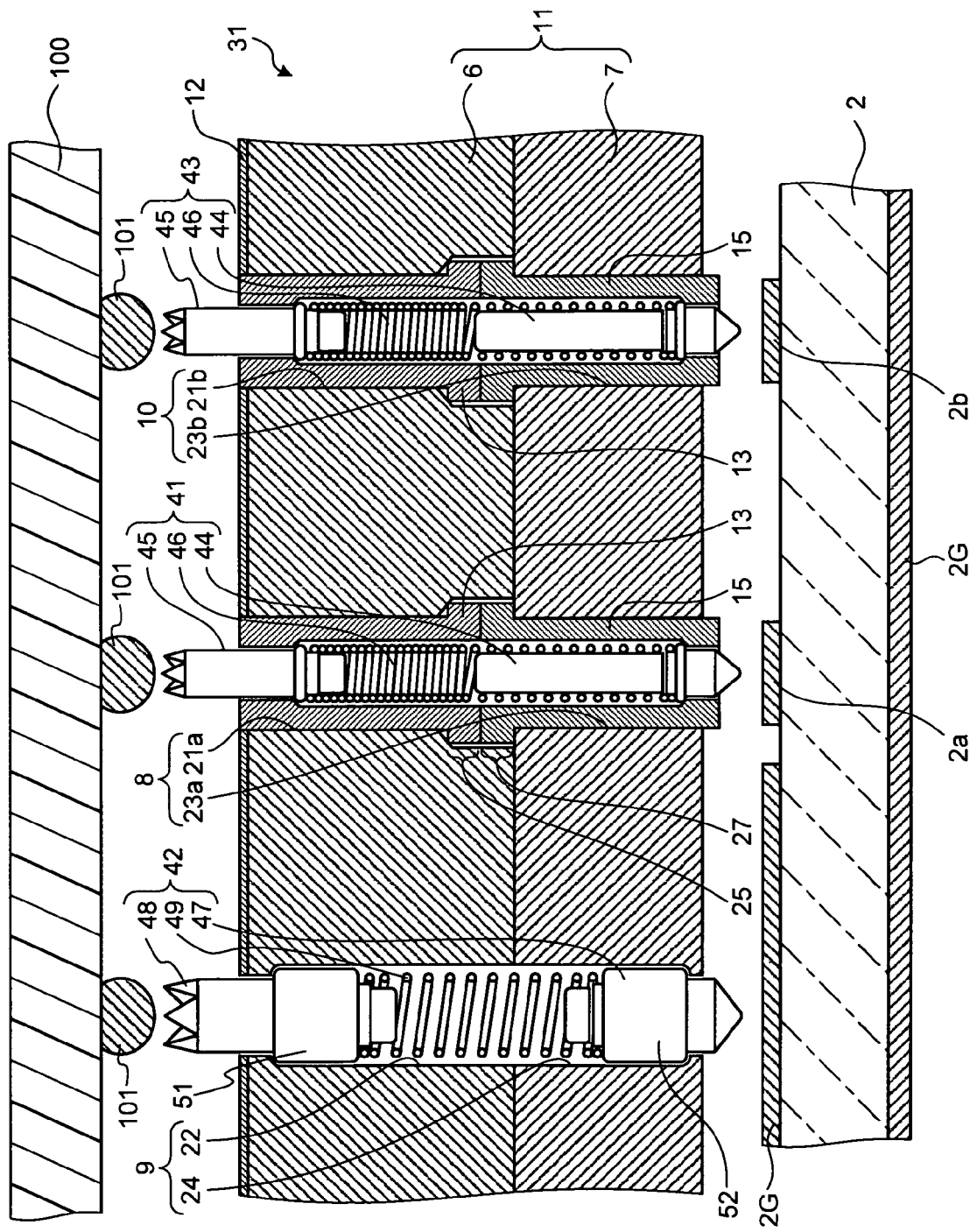
FIG. 3 is a schematic of detailed structures of a conductive contact holder and conductive contacts included in a conductive contact unit according to a second embodiment of the present invention.

FIG. 3 is a schematic of a structure of a conductive contact holder according to a second embodiment of the present invention. The structure of the conductive contact unit is the same as that of the conductive contact unit 1 described above, except for a detailed structure of the conductive contact holder.

A conductive contact holder 31 shown in FIG. 3 is for accepting the conductive contacts 4, and includes: the holder substrate 11 having the first substrate 6 and the second substrate 7; the first insulating pipe members 13 that are inserted into the fourth openings 21a and 21b of the first substrate 6; second insulating pipe members 15 that are inserted into the sixth openings 23a and 23b of the second substrate 7. Out of the surfaces of the holder substrate 11, the fluorine coat 12 is formed on the surface of the first substrate 6, in the same manner as described for the first embodiment.

A disengagement-preventing flange 27 is formed at an end of the second insulating pipe member 15, and this disengagement-preventing flange 27 is inserted into the second substrate 7 facing the boundary between the first substrate 6 and the second substrate 7. The second insulating pipe member 15 has a certain length in a longitudinal direction thereof so that, when the second insulating pipe member 15 is inserted into the second substrate 7, the second insulating pipe member 15 protrudes from the surface of the second substrate 7 (the bottom surface of the holder substrate 11 in FIG. 3).

Except for those described above, the structure of the conductive contact holder 31 is the same as that of the conductive contact holder 3, explained above for the first embodiment. Therefore, the same portions as those provided to the conductive contact holder 3 are assigned with the same reference numbers.

Figure 4:
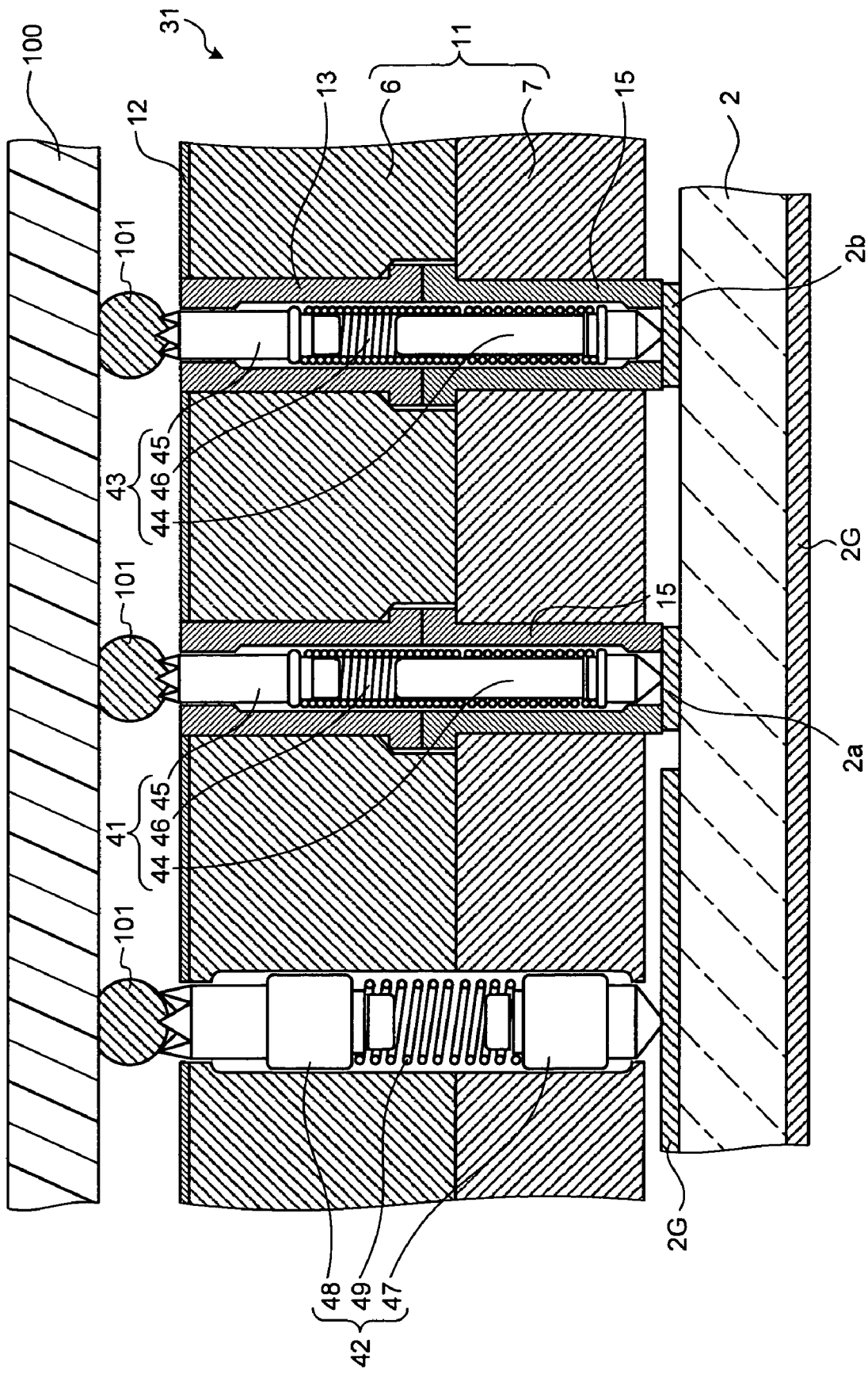
FIG. 4 is a schematic of positions of the conductive contact holder and the conductive contacts included in the conductive contact unit according to the second embodiment during a test.

FIG. 4 is a schematic of the conductive contact holder 31 during a test with the semiconductor integrated circuit 100 mounted thereto, and the conductive contacts 4 being brought in contact with the connecting electrodes 101. Upon conducting a test of the semiconductor integrated circuit 100 using the conductive contact holder 31, the semiconductor integrated circuit 100 is brought in contact with the conductive contacts 4. Moreover, ends of the second insulating pipe members 15 are also brought in contact with the signaling electrode 2a and the power-supplying electrode 2b on the circuit substrate 2. This arrangement prevents a short circuit caused by the surface of the second substrate 7 contacting the signaling electrode 2a and the power-supplying electrode 2b. This arrangement also prevents the conductive contact holder 31 from being applied with an excessive pressure, advantageously.

In FIG. 3, the fluorine coat is not formed on the surface closer to the circuit substrate 2, that is, the surface of the second substrate 7 (the bottom surface of the holder substrate 11 in FIG. 4); however, it is also possible to form the fluorine coat 12 on the surface closer to the second substrate 7.

According to the second embodiment described above, the conductive contact holder includes: a holder substrate having the first opening that accepts the signaling conductive contact that inputs and outputs a signal to and from the circuitry, and the second opening that accepts the grounding conductive contact for supplying the ground potential to the circuitry; the first holding member that is inserted into the first opening and holds the signaling conductive contact; and the insulating coat (fluorine resin) that is made of an insulating material and covers at least one surface of the holder substrate. Therefore, it is possible to realize the conductive contact holder and the conductive contact unit having the insulating layer with improved corrosion resistance, as well as having excellent durability, in the same manner as in first embodiment.

Furthermore, according to the second embodiment, the insulating coat is provided on the surface of the holder substrate, and the second insulating pipe member is positioned to protrude from the other surface. Therefore, it is possible to secure the insulation between the electrodes of the circuit substrate or that of semiconductor integrated circuit (test object) and the surface of the holder substrate; thus, preventing them from being brought in contact with each other and causing a short circuit.

Third Embodiment

Figure 5:
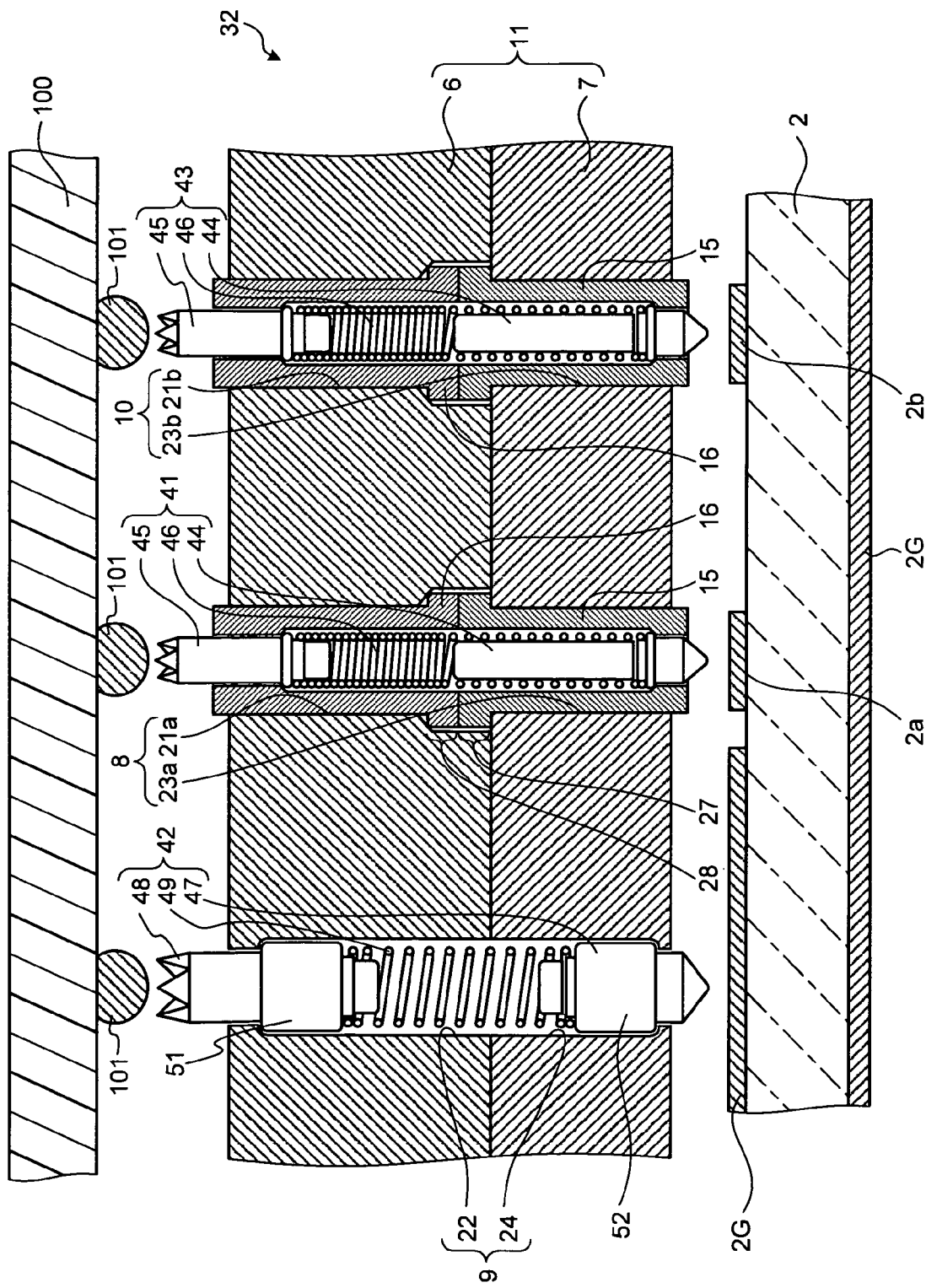
FIG. 5 is a schematic of detailed structures of a conductive contact holder and conductive contacts included in a conductive contact unit according to a third embodiment of the present invention.

FIG. 5 is a schematic of a structure of a conductive contact holder according to a third embodiment of the present invention. The structure of the conductive contact unit is the same as that of the conductive contact unit 1 described above, except for a detailed structure of the conductive contact holder.

A conductive contact holder 32 shown in FIG. 5 is for accepting the conductive contacts 4i and includes: the holder substrate 11 having the first substrate 6 and the second substrate 7; first insulating pipe members 16 that are inserted into the fourth openings 21a and 21b formed on the first substrate 6; and the second insulating pipe members 15 that are inserted into the sixth openings 23a and 23b formed on the second substrate 7.

A disengagement-preventing flange 28 is formed at an end of the second insulating pipe member 16, and this disengagement-preventing flange 28 is inserted into the first substrate 6 facing the boundary between the first substrate 6 and the second substrate 7. The first insulating pipe member 16 has a certain length in a longitudinal direction thereof so that, when the first insulating pipe member 16 is inserted into the first substrate 6, the first insulating pipe member 16 protrudes from the surface of the first substrate 6 (the top surface of the holder substrate 11 in FIG. 3). According to the third embodiment, no fluorine coat is formed on the surface of the first substrate 6.

Except for those described above, the structure of the conductive contact holder 32 is the same as that of the conductive contact holder 31, explained above for the second embodiment. Therefore, the same portions as those provided to the conductive contact holder 31 are assigned with the same reference numbers.

Figure 6:
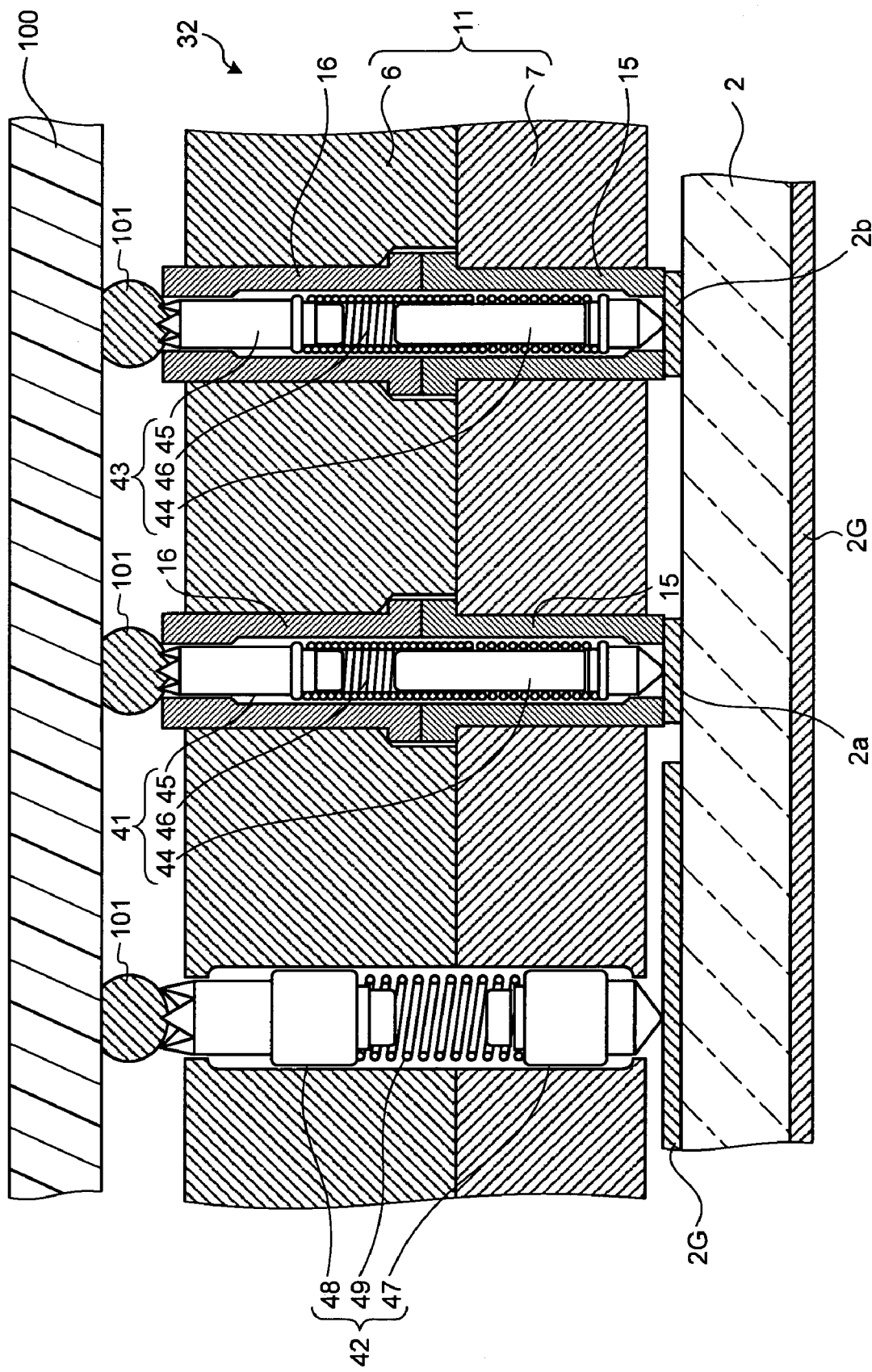
FIG. 6 is a schematic of positions of the conductive contact holder and the conductive contacts included in the conductive contact unit according to the third embodiment during a test.

FIG. 6 is a schematic of the conductive contact holder 32 during a test with the semiconductor integrated circuit 100 mounted thereto, and the conductive contacts 4 being brought in contact with the connecting electrodes 101. In the arrangement shown in FIG. 6, ends of the first insulating pipe members 16 are brought in contact with ends of the connecting electrodes 101 provided on the semiconductor integrated circuit 100, and ends of the second insulating pipe members 15 are brought in contact with the signaling electrode 2a and the power-supplying electrode 2b provided to the circuit substrate 2. This arrangement prevents a short circuit caused by the surface of the first substrate 6 being brought in contact with the connecting electrode 101, or by the surface of the second substrate 7 being brought in contact with the signaling electrode 2a or the power-supplying electrode 2b. This arrangement also prevents the conductive contact holder 32 from being applied with an excessive pressure, advantageously.

In FIG. 5, the fluorine coat is not formed on the surfaces of the holder substrate 11; however, it is also possible to form the fluorine coat 12 on the surfaces of the first substrate 6 and the second substrate 7, respectively, in the same manner as in the first embodiment.

According to the third embodiment described above, the conductive contact holder includes: a holder substrate having the first opening that accepts the signaling conductive contact that inputs and outputs a signal to and from the circuitry, and the second opening that accepts the grounding conductive contact for supplying the ground potential to the circuitry; and the first holding member, made of an insulating material, that is inserted into the first opening and holds the signaling conductive contact. Furthermore, the first holding member has a structure where both ends thereof protrude from the surface of the holder substrate. Therefore, it is possible to realize the conductive contact holder and the conductive contact unit having the insulating layer with improved corrosion resistance, as well as having excellent durability.

Furthermore, according to the third embodiment, the first and the second insulating pipe members are positioned to protrude from the surface of the holder substrate. Therefore, it is possible to secure the insulation between the electrodes of the circuit substrate or those of semiconductor integrated circuit (test object) and the surface of the holder substrate; thus, preventing them from being brought in contact with each other and causing a short circuit.

Fourth Embodiment

Figure 7:
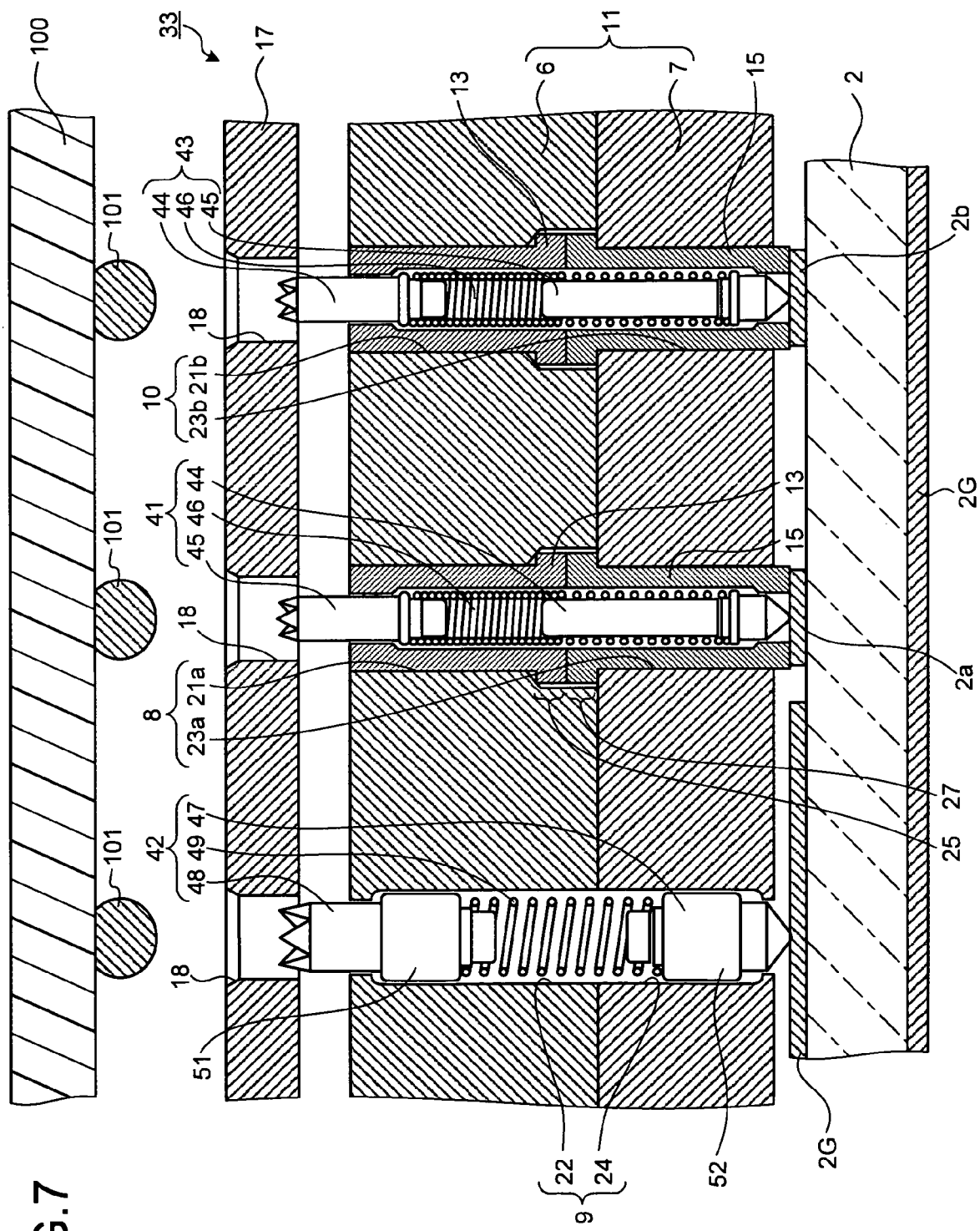
FIG. 7 is a schematic of detailed structures of a conductive contact holder and conductive contacts included in a conductive contact unit according to a fourth embodiment of the present invention.

FIG. 7 is a schematic of a structure of a conductive contact holder according to a fourth embodiment of the present invention. The structure of the conductive contact unit is the same as that of the conductive contact unit 1 described above, except for a detailed structure of the conductive contact holder.

A conductive contact holder 33 shown in FIG. 7 is for accepting the conductive contacts 4, and includes: the holder substrate 11 having the first substrate 6 and the second substrate 7; the first insulating pipe members 13 that are inserted into the fourth openings 21a and 21b formed on the first substrate 6; the second insulating pipe members 15 that are inserted into the sixth openings 23a and 23b formed on the second substrate 7; and a flat, plate-like floating member 17 that is made of an insulating material and interposed between the first substrate 6 and the semiconductor integrated circuit 100. An flexible member (not shown) is interposed around the periphery between the floating member 17 and that of the first substrate 6, keeping the floating member 17 floated away from the first substrate 6 when the semiconductor integrated circuit 100 is not mounted (see FIG. 7).

The floating member 17 has a plurality of holes 18 that are formed to match the arrangement pattern of the connecting electrodes 101 provided on the semiconductor integrated circuit 100. The holes 18 have a diameter that enables the corresponding connecting electrodes 101 to be inserted therein, but is smaller than that of the first insulating pipe member 13. The floating member 17 has a function to align approximate positions of the connecting electrodes 101 before the connecting electrodes 101 are brought in contact with the conductive contacts 4. In this sense, by tapering the edges of the holes 18 on the side of the semiconductor integrated circuit 100, as shown in FIG. 7, it is possible to prevent the floating member 17 from touching the connecting electrode 101 and damaging the surface thereof upon aligning the connecting electrodes 101.

Except for those described above, the structure of the conductive contact holder 33 is the same as that of the conductive contact holder 32, explained above for the third embodiment. Therefore, the same portions as those provided to the conductive contact holder 32 are assigned with the same reference numbers.

FIG. 8 is a schematic of the conductive contact holder 32 during a test with the semiconductor integrated circuit 100 mounted thereto. In FIG. 8, the floating member 17 is pressed downwardly by the substrate of the semiconductor integrated circuit 100, pressed down against the elastic force of the flexible member interposed between the floating member 17 and the first substrate 6, and brought in contact with the surface of the first substrate 6 to bring the conductive contacts 4 in contact with the connecting electrodes 101. In the arrangement shown in FIG. 8, the top ends of the needle-shaped members of the conductive contacts 4 are brought in contact with the connecting electrodes 101, which are held in the holes 18 provided in the floating member 17. The areas around the bottom end of the holes 18 are brought in contact with the upper ends of the first insulating pipe members 13. Therefore, the surface of the first substrate 6 can be prevented from being brought in contact with the connecting electrodes 101 and causing a short circuit. On the other hand, in the second substrate 7, the ends of the second insulating pipe members 15, protruding from the surface of the second substrate 7, are brought in contact with the signaling electrode 2a and the power-supplying electrode 2b on the circuit substrate 2, in the same manner as in the second and the third embodiments. In this manner, the surface of the second substrate 7 is prevented from being brought in contact with the signaling electrode 2a and the power-supplying electrode 2b.

In FIG. 7, the fluorine coat is not formed on the surfaces of the holder substrate 11; however, it is also possible to form the thin-film fluorine coat 12 on the surfaces of the first substrate 6 and second substrate 7, respectively, in the same manner as in the first embodiment.

According to the fourth embodiment described above, the conductive contact holder includes: a holder substrate having the first opening that accepts the signaling conductive contact that inputs and outputs a signal to and from the circuitry, and the second opening that accepts the grounding conductive contact for supplying the ground potential to the circuitry; and the first holding member that is made of an insulating material, inserted into the first opening, and holds the signaling conductive contact. Furthermore, the first holding member has a structure where one end thereof protrudes from the surface of the holder substrate. Therefore, it is possible to realize the conductive contact holder and the conductive contact unit having the insulating layer with improved corrosion resistance, as well as having excellent durability.

Furthermore, according to the fourth embodiment, the conductive contact holder further includes a flat, plate-like floating member that is arranged facing to the other surface of the holder substrate that does not have the protrusion of the end of the first holding member, and having a plurality of holes corresponding to the wiring patterns of the circuitry. Therefore, it is possible to secure the insulation between the electrodes of the circuit substrate or that of semiconductor integrated circuit (test object) and the surface of the holder substrate; thus, preventing them from being brought in contact with each other and causing a short circuit.

Other Embodiments

The first to the fourth embodiments have been described as the best mode for carrying out the present invention. However, the scope of the present invention should not be limited by these four embodiments. Moreover, in the description above, the present invention is assumed to be used for an integrated circuit, such as a semiconductor chip; however, the present invention should not be interpreted as being limited to such an application, and also may be applied to an apparatus for detecting the characteristics of an liquid crystal panel, for example. Furthermore, the structures of the conductive contacts should not be limited to those described above, and it is also possible to use conductive contacts having other structures.

No reference was made with regard to a transmission method of the input and output signals for the conductive contact unit according to the present invention; however, if the conductive contact unit is used for high-frequency transmission, it can be applied either to the single-ended transmission and the differential transmission. In other words, the conductive contact unit according to the present invention can be used regardless of the type of the transmission methods.

Still furthermore, it is possible to use an insulating material other than the fluorine resin as the insulating coat, if the insulating material has a corrosion resistance against, for example, gold plating, of the same level as the fluorine resin.

As described above, the present invention may include various embodiments that are not described herein and various design modifications are still possible within the scope of the present invention, without deviating from the technical concepts specified by the appended claims.

INDUSTRIAL APPLICABILITY

As described above, the conductive contact holder and the conductive contact unit according to the present invention are useful for testing electrical characteristics of a semiconductor integrated circuit.

The invention claimed is:

1. A conductive contact holder that contains at least a signaling conductive contact for inputting and outputting a signal to and from a circuitry, and a grounding conductive contact that supplies a ground potential to the circuitry, the conductive contact holder comprising:

a holder substrate that is made of a conductive material, and has a first opening for accepting the signaling conductive contact and a second opening for accepting the grounding conductive contact;

a first holding member that is made of an insulating material, and inserted into the first opening to hold the signaling conductive contact; and an insulating coat that is made of an insulating material, and covers at least one surface of the holder substrate.

2. The conductive contact holder according to claim 1, wherein the insulating coat is provided on one surface of the holder substrate, and the first holding member protrudes from a surface of the holder substrate on which the insulating coat is not provided.

3. The conductive contact holder according to claim 1, wherein the insulating coat is made of fluorine resin.

4. The conductive contact holder according to claim 1, wherein an inner circumferential surface of the second opening is gold-plated.

5. The conductive contact holder according to claim 1, wherein the holder substrate further includes a first substrate that is made of a conductive material, and has a fourth opening and a fifth opening corresponding respectively to the first opening and the second opening; and a second substrate that is made of a conductive material, has a sixth opening and a seventh opening corresponding respectively to the first opening and the second opening, and is fixed to the first substrate so that the sixth opening communicates with the fourth opening and the seventh opening communicates with the fifth opening, and the first holding member includes a first insulating pipe member that is inserted into the fourth opening; and a second insulating pipe member that is inserted into the sixth opening.

6. The conductive contact holder according to claim 5, wherein the first insulating pipe member has a disengagement-preventing flange at one end thereof, and the disengagement-preventing flange is inserted in the fourth opening so as to face a boundary between the first substrate and the second substrate, and the second insulating pipe member has a disengagement-preventing flange at one end thereof, and the disengagement-preventing flange is inserted in the sixth opening so as to face the boundary between the first substrate and the second substrate.

7. The conductive contact holder according to claim 1, wherein the holder substrate has a third opening for accepting a power-supplying conductive contact for supplying power to the circuitry, and the conductive contact holder further includes a second holding member that is made of an insulating material, and inserted into the third opening to hold the power-supplying conductive contact.

8. A conductive contact holder that contains at least a signaling conductive contact for inputting and outputting a signal to and from a circuitry, and a grounding conductive contact that supplies a ground potential to the circuitry, the conductive contact holder comprising:

a holder substrate that is made of a conductive material, and has a first opening for accepting the signaling conductive contact and a second opening for accepting the grounding conductive contact; and a first holding member that is made of an insulating material, and inserted into the first opening to hold the signaling conductive contact, wherein at least one end of the first holding member protrudes from a surface of the holder substrate.

9. The conductive contact holder according to claim 8, further comprising:

a plate-like floating member that is arranged facing a surface of the holder substrate, from which surface the end of the first holding member does not protrude, and that includes a plurality of holes arranged correspondingly to wiring patterns of the circuitry.

10. The conductive contact holder according to claim 8, wherein an inner circumferential surface of the second opening is gold-plated.

11. The conductive contact holder according to claim 8, wherein the holder substrate further includes a first substrate that is made of a conductive material, and has a fourth opening and a fifth opening corresponding respectively to the first opening and the second opening; and a second substrate that is made of a conductive material, has a sixth opening and a seventh opening corresponding respectively to the first opening and the second opening, and is fixed to the first substrate so that the sixth opening communicates with the fourth opening and the seventh opening communicates with the fifth opening, and the first holding member includes a first insulating pipe member that is inserted into the fourth opening; and a second insulating pipe member that is inserted into the sixth opening.

12. The conductive contact holder according to claim 11, wherein the first insulating pipe member has a disengagement-preventing flange at one end thereof, and the disengagement-preventing flange is inserted in the fourth opening so as to face a boundary between the first substrate and the second substrate, and the second insulating pipe member has a disengagement-preventing flange at one end thereof, and the disengagement-preventing flange is inserted in the sixth opening so as to face the boundary between the first substrate and the second substrate.

13. The conductive contact holder according to claim 8, wherein the holder substrate has a third opening for accepting a power-supplying conductive contact for supplying power to the circuitry, and the conductive contact holder further includes a second holding member that is made of an insulating material, and inserted into the third opening to hold the power-supplying conductive contact.

14. A conductive contact unit comprising:

a signaling conductive contact that inputs and outputs a signal to and from a circuitry a grounding conductive contact that supplies a ground potential to the circuitry;

a conductive contact holder that contains at least the signaling conductive contact and the grounding conductive contact, the conductive contact holder including a holder substrate that is made of a conductive material, and has a first opening for accepting the signaling conductive contact and a second opening for accepting the grounding conductive contact;

a first holding member that is made of an insulating material, and inserted into the first opening to hold the signaling conductive contact; and an insulating coat that is made of an insulating material, and covers at least one surface of the holder substrate; and a circuit substrate that is electrically connected to at least the signaling conductive contact, and has a circuit that generates the signal to be input to the circuitry.

15. A conductive contact unit comprising:

a signaling conductive contact that inputs and outputs a signal to and from the circuitry, contained in the conductive contact holder;

a grounding conductive contact that supplies a ground potential to the circuitry;

a conductive contact holder that contains at least the signaling conductive contact and the grounding conductive contact, the conductive contact holder including a holder substrate that is made of a conductive material, and has a first opening for accepting the signaling conductive contact and a second opening for accepting the grounding conductive contact;

a first holding member that is made of an insulating material, and inserted into the first opening to hold the signaling conductive contact, wherein at least one end of the first holding member protrudes from a surface of the holder substrate; and a circuit substrate that is electrically connected to at least the signaling conductive contact, and has a circuit that generates the signal to be input to the circuitry.

* * * * *